United States Patent [19]

Fauser et al.

[11] Patent Number: 4,716,372
[45] Date of Patent: Dec. 29, 1987

[54] CIRCUIT ARRANGEMENT FOR MONITORING THE CURRENT SUPPLY OF AN ELECTRIC CONSUMER

[75] Inventors: Edwin Fauser, Ditzingen; Hans List, Pforzheim, both of Fed. Rep. of Germany

[73] Assignee: Robert Bosch GmbH, Stuttgart, Fed. Rep. of Germany

[21] Appl. No.: 908,812
[22] PCT Filed: Oct. 30, 1985
[86] PCT No.: PCT/DE85/00430
§ 371 Date: Aug. 18, 1986
§ 102(e) Date: Aug. 18, 1986
[87] PCT Pub. No.: WO86/03860
PCT Pub. Date: Jul. 3, 1986

[30] Foreign Application Priority Data

Dec. 18, 1984 [DE] Fed. Rep. of Germany ....... 3446129

[51] Int. Cl.$^4$ ................ H03K 5/24; G01R 19/165
[52] U.S. Cl. .................... 328/146; 307/296 R; 307/358; 307/592; 307/597; 361/90
[58] Field of Search ............ 307/358, 296 R, 592, 307/597, 104, 141.4, 152, 200 A; 328/146, 147, 149; 361/90

[56] References Cited

U.S. PATENT DOCUMENTS

| | | | |
|---|---|---|---|
| 4,428,020 | 1/1984 | Blanchard, Jr. | 361/90 |
| 4,536,667 | 8/1985 | Masuda | 307/296 R |
| 4,594,517 | 6/1986 | Cohen et al. | 307/296 R |

*Primary Examiner*—John Zazworsky
*Attorney, Agent, or Firm*—Walter Ottesen

[57] ABSTRACT

A circuit arrangement for monitoring the current supply of an electric consumer has a voltage regulator connected to an operating voltage that is variable over time and has a voltage monitor for switching on a consumer exclusively during the constant phase of the supply voltage. The voltage monitor is defined by a comparator at one input of which a reference voltage proportional to the regulator output voltage is present and at the other input of which a difference voltage picked up at the regulator output and exceeding a threshold value is present. A switch-on and switch-off signal can be take off at the comparator output.

8 Claims, 1 Drawing Figure

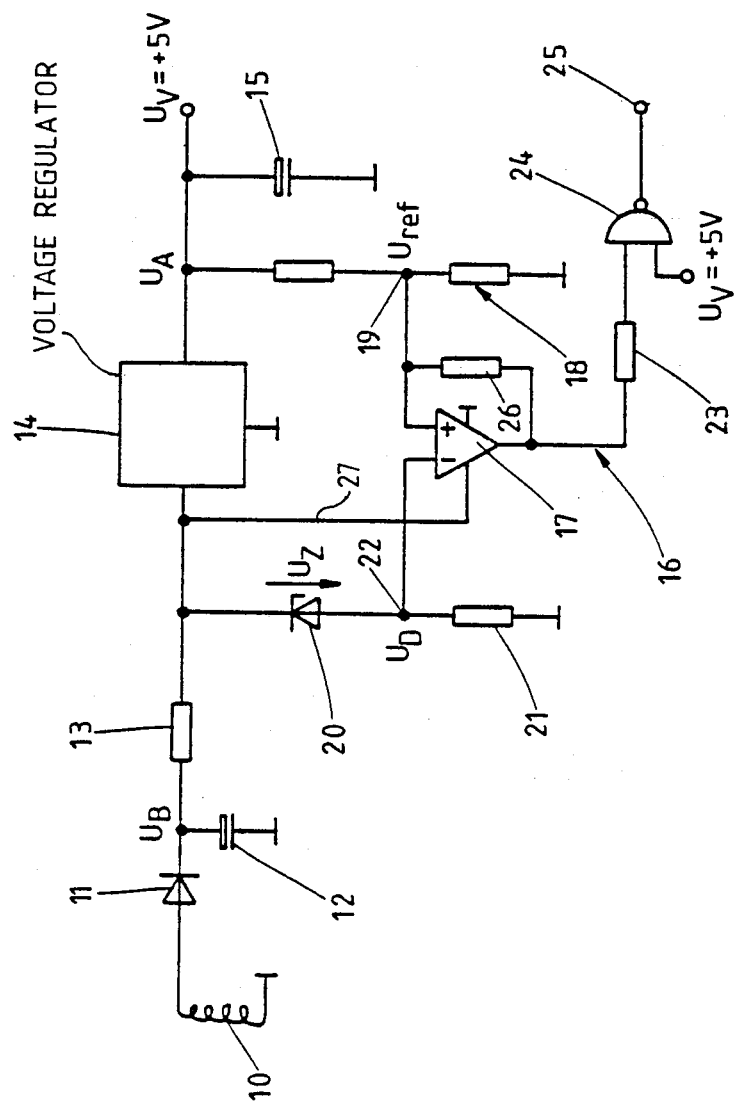

CIRCUIT ARRANGEMENT FOR MONITORING THE CURRENT SUPPLY OF AN ELECTRIC CONSUMER

STATE OF THE ART

The invention relates to a circuit arrangement for monitoring the current supply of an electric consumer, in particular of a microcomputer on a mobile data carrier with inductive energy transmission, as defined by the preamble to claim 1.

In mobile data carriers, as embodied by workpiece carriers revolving in automatic transfer lines or assembly lines, the supply energy for the switching circuits disposed on the data carrier are transmitted inductively from processing and control stations arranged along the transfer or assembly lines, specifically by intermittent inductive coupling of transformer coils, present in the fixed station and on the data carrier, at the moment the data carrier travels through the fixed station. This produces an operating voltage for the data carrier, which is dependent on many variables, such as the distance between the transformer coils and the data carrier on the one hand and the fixed station on the other, the speed of the data carrier, and the like and therefore varies within wide limits. However, the microcomputer provided on the data carrier for controlling data transmission to the fixed station and for data processing in the data carrier requires a constant supply voltage, so that it has to be switched on and off in accordance with voltage, and an accurate power-up and power-down sequence must be adhered to.

A supply voltage monitor is also known (Texas Instruments component TL 7702) that monitors the magnitude of a stabilized supply voltage, which can be picked up at the output of a voltage regulator (component 78 L 05), and when a rated value is attained generates a startup pulse for a consumer, this pulse being present with a delay time until the supply voltage drops below the rated value. Because of the imprecision of the tolerance of the stabilized supply voltage, the rated value is dimensioned to be lower than the stabilized supply voltage, so that with the aid of the delay time, the startup pulse triggers the switching on of the consumer approximately when the supply voltage is attained.

The known voltage monitor, which is intended for power packs, cannot be used whenever the rise speed of the input voltage of the voltage regulator differs greatly from one instance to another, as happens with the current supply of mobile data carriers, because when the inductively transmitted operating voltage is dependent on the greatly varying speed of the data carrier as it travels past the fixed station. In that case, it is impossible to fix a favorable value for the delay time of the startup pulse. Moreover, when the supply voltage drops, the known voltage monitor switches only after the stable state of the supply voltage has already been left behind. There is then an inadequate reserve for the power-down sequence. In general, it is not possible with the known voltage monitor to exert any influence on power reserves.

ADVANTAGES OF THE INVENTION

The circuit arrangement of the invention has the advantage that the startup signal for the current consumer is triggered precisely upon attainment of the stabilized supply voltage, and under no circumstances beforehand, and that upon shutdown the power reserves are fully exhausted, because the shutdown signal for the current consumer is triggered whenever the current is still just adequate for supplying the consumer with a constant supply voltage. Tolerances of the voltage regulator, the current drawn by the circuit arrangement and the rise speed of the operating voltage no longer have any influence at all. By means of comparator dimensioning, either an immediate startup of the consumer or a delayed startup of the consumer is performed only when excess power is available. By picking up the reference voltage at the regulator output, the stability of the reference voltage is assured. Forming the threshold at the regulator input provides a pre-stabilization of the voltage regulator, so that standard deviations, and deviations of the supply voltage from its constant value dictated thereby, are lessened.

The comparator is given a hysteresis which suppresses the influence of load fluctuations dictated by a variable current consumption by the consumer.

DRAWING

The invention is explained in further detail in the ensuing description, referring to an exemplary embodiment shown in the drawing. The drawing shows a circuit arrangement, integrated into a mobile data carrier, for monitoring the current supply of an electronic consumer, in particular of a microcomputer.

DESCRIPTION OF THE EXEMPLARY EMBODIMENT

The circuit arrangement shown in the circuit diagram, for monitoring the current supply of an electrical consumer, in this case a microcomputer not shown in further detail, is accommodated on a mobile data carrier with inductive energy transmission. Such data carriers are disposed on workpiece carriers, which travel through an automatic transfer line on a conveyor belt or assembly line; the data carriers communicate with fixedly arranged processing or control stations and trigger automatic processing or control or conveying commands. By way of example, a transfer line of this type is described in detail in published German patent application No. DE-OS 33 31 694. As also explained therein, the supply of energy to the data carrier is effected from the fixed station, specifically during the travel of the data carrier through the fixed station and during the thereby-dictated inductive coupling, which is attained by providing that a transformer coil 10, which is disposed on the data carrier, is moved past a transformer coil which is disposed in the fixed station and connected to a current source. During the period of time of the inductive coupling with the transfer coil of the fixed station, the transformer coil 10, to which the series circuit comprising a diode 11 and a capacitor 12 is connected in parallel, furnishes an operating voltage $U_B$, which is variable over time and is picked up at the output of the capacitor 12 and delivered via a resistor 13 to a voltage regulator 14. The voltage regulator 14, embodied as an integrated circuit IC 78 L 05, serves to generate a supply voltage $U_V$, which is approximately constant for a predetermined period of time, for the microcomputer and other switching circuits; this voltage is +5 V in this instance and can be picked up at a second capacitor 15 connected parallel to the regulator output. Since the voltage regulator can regulate a constant supply voltage $U_V$ of such constancy only if a predetermined minimum voltage is present at its input, but on the other hand the operating voltage $U_V$ of the circuit arrangement rises from zero and then drops back to zero upon each passage through a fixed station, a voltage monitor 16 is provided, which switches on the current consumer, in this case in the form of a microcomputer, only during the period of time in which the supply voltage $U_B$ is constantly 5 V. This period of time is defined by the instant of the rise of the regulator output voltage $U_A$ to the constant supply voltage $U_V$ and prior to the drop of the regulator output voltage $U_A$ below the constant supply voltage of 5 V. To this end, the voltage monitor 16 has a comparator 17, at one input of which a reference voltage $U_{ref}$ proportional to the regulator output voltage $U_A$ and at the other input of which a differential voltage $U_D$ exceeds a threshold value, are present. The operating voltage of the comparator 17 is taken off at the voltage input of the voltage regulator 14 via lead 27. To obtain the reference voltage $U_{ref}$, a voltage divider 18 is connected parallel to the regulator output, the voltage pickup 19 of which is connected to the noninverting input of the comparator 17. To derive the differential voltage $U_D$, a series circuit comprising a Zener diode 20 and a resistor 21 is connected parallel to the regulator input, and the junction 22 of the Zener diode output and the resistor 21 is connected to the inverting input of the comparator 17. The voltage drop appearing at the resistor 21 is a standard measurement for the differential voltage $U_D$. The Zener voltage $U_Z$, here 7.5 V, should be selected higher than the supply voltage $U_V$ of 5 V, but not too high, so that it is assured that after the charging of the capacitor 15—that is, whenever the current furnished to the voltage regulator 14 becomes higher than that picked up at the output of the voltage regulator—the voltage at the input of the voltage regulator 14 rises to the Zener voltage, and thus the excess current flows away via the Zener diode 20 and at the resistor 21 generates the differential voltage $U_D$.

At the output of comparator 17, one input of the NAND gate 24 is connected via resistor 23 whereas the other input is connected to a supply voltage $U_V$ of 5 V. A switch-on signal logic 1 for the consumer and a switch-off signal logic 0 for the consumer can be taken from the output 25 of NAND gate 24. The output of the comparator 17 is also connected via a coupling resistor 26 with the non-inverting input of the comparator 17. With this feedback a switching hysteresis is produced by means of which the input of the load variations is suppressed.

The function of the switching arrangement is as follows:

When the data carrier passes through a fixed station and as a consequence the transmission coil 10 is momentarily inductively coupled with a current supplied transmission coil in the fixed station, the operating voltage $U_B$ at the output of the capacitor 12 rises slowly. Since the Zener diode 20 is still blocked, the voltage $U_Z$ on the Zener diode 20 also rises. The voltage regulator 14 switches the voltage $U_Z$ completely on the regulator output so that the output voltage $U_A$ of the voltage regulator 14 likewise rises. The differential voltage $U_D$ which drops across resistor 21 is zero whereas the reference voltage $U_{ref}$ takes on a positive value so that the comparator 17 becomes positive. The output 25 of the NAND gate assumes the value of logical 0. As long as the shutoff signal of logical 0 is present, the current consumer, in this case the microcomputer, remains shut off.

With the rise of the regulator output voltage $U_A$, the capacitor 15 is also charged, causing the current through the voltage regulator 14 initially to be higher than the later operating current. Once the regulator output voltage $U_A$ attains the constant supply voltage $U_V = 5$ V, no further charge needs to be supplied to the capacitor 15, and the voltage regulator 14 immediately decreases the current, causing the voltage $U_Z$ to rise abruptly. The Zener diode 20 becomes conductive and takes on the excess current. As a result, the differential voltage $U_D$ that is dropping at the resistor 21 rises quickly as well. As soon as the differential voltage $U_D$ exceeds the now-constant reference voltage $U_{ref}$, the output of the comparator 17 assumes the value of logical 0, and the output 25 of the NAND gate 24 flips to logical 1. The current consumer, in this case the microcomputer, is switched on, and its activation state is maintained as long as the output 25 of the NAND gate 24 maintains a value of logical 1.

If the inductive coupling of the transformer coil 10 with the transformer coil of the fixed station is canceled, then first the operating voltage $U_B$ at the capacitor 12 drops to such an extent that the current in the Zener diode 20 drops toward zero. At this instant, the energy is still sufficient for maintaining the supply voltage $U_V$ at 5 V. The voltage $U_D$ at the resistor 21 drops below the reference voltage $U_{ref}$, and the output of the comparator 17 becomes positive once again. Thus the output 25 of the NAND gate 24 flips over to logical 0 and the consumer is shut off, until such time as the output 25 of the NAND gate 24, upon the next startup of the operating voltage $U_B$, flips back over to logical 1.

What is claimed is:

1. A circuit arrangement for monitoring the current supply of an electric consumer such as a microcomputer on a mobile data carrier wherein energy is transferred inductively, the circuit arrangement comprising:

inductive means for receiving the energy transferred inductively to provide an operating voltage which changes with time to rise above a predetermined minimum value and to then fall below this minimum value;

voltage regulator means receiving said operating voltage and generating a regulator output voltage which defines an approximately constant supply voltage so long as said operating voltage is above said minimum value; and, voltage monitor means for providing a switch-on signal switching the consumer on and a switch-off signal for switching off the consumer after said regulator output voltage rises to said supply voltage and before said regulator output falls below said supply voltage, said voltage monitor means including:

reference voltage circuit means for supplying a reference voltage proportional to said regulator output voltage;

difference voltage circuit means for supplying a difference voltage exceeding a predetermined threshold value, said threshold value being selected so that said difference voltage first exceeds and then drops beneath said reference voltage when said regulator output voltage has reached and not yet dropped below said supply voltage;

a comparator having a first input for receiving said reference voltage and a second input for receiving said difference voltage, said comparator further having an output for providing said switch-on signal and said switch-off signal.

2. The circuit arrangement of claim 1, said reference voltage circuit means comprising a capacitor connected to the output of said voltage regulator means; and, a voltage divider connected parallel to said capacitor and having a tap connection for taking off said reference voltage.

3. The circuit arrangement of claim 2, said difference voltage circuit means comprising a series circuit connected in parallel with the input of said voltage regulator means, said series circuit including a Zener diode and a resistor, said Zener diode and said resistor being serially interconnected to conjointly define a connecting node, said difference voltage being taken off said resistor as a voltage drops thereacross.

4. The circuit arrangement of claim 3, said tap connection of said voltage divider being connected to said first input of said comparator and said connecting node being connected to said second input of said comparator, said first and second inputs being noninverting and inverting inputs, respectively.

5. The circuit arrangement of claim 1, said voltage monitor means including a NAND gate having one input connected to said output of said comparator and an other input connected to said supply voltage, said NAND gate providing the consumer with a switch-on signal in the form of a logic 1 signal and a switch-off signal in the form of a logic 0 signal.

6. The circuit arrangement of claim 4, said comparator including a coupling resistor connecting the output of said comparator with said noninverting input thereof.

7. The circuit arrangement of claim 1, wherein said comparator has an operating voltage input connected to the input of said voltage regulator means.

8. The circuit arrangement of claim 3, the Zener voltage of said Zener diode being selected so as to be slightly greater than said supply voltage.

* * * * *